United States Patent [19]
Blattner et al.

[11] Patent Number: 5,975,825
[45] Date of Patent: Nov. 2, 1999

[54] TRANSFER APPARATUS FOR WAFERS

[75] Inventors: Jakob Blattner, Ermatingen; Rolf Bachmann, Schoenenberg a.d. Thur; Hans Schmid, Langnau a. Albis, all of Switzerland

[73] Assignee: Tec-Sem AG, Switzerland

[21] Appl. No.: 08/892,391

[22] Filed: Jul. 14, 1997

[30] Foreign Application Priority Data

Mar. 5, 1997 [CH] Switzerland .......................... 97107352

[51] Int. Cl.[6] ........................................ F24F 7/00
[52] U.S. Cl. .................. 414/217; 414/773; 414/778; 414/783; 414/411; 414/811; 414/816; 414/939; 414/940
[58] Field of Search ................... 414/773, 778, 414/783, 940, 939, 217, 411, 811, 816

[56] References Cited

U.S. PATENT DOCUMENTS

| 4,674,936 | 6/1987 | Bonora ..................... 414/217 |
| 4,676,709 | 6/1987 | Bonora et al. ............. 414/940 |
| 4,705,444 | 11/1987 | Tullis et al. .............. 414/217 |
| 4,963,069 | 10/1990 | Wurst et al. .............. 414/940 |
| 5,547,328 | 8/1996 | Bonora et al. ............. 414/217 |
| 5,655,869 | 8/1997 | Scheler et al. ............ 414/411 |
| 5,674,039 | 10/1997 | Walker et al. ............. 414/411 |

FOREIGN PATENT DOCUMENTS

| 0 209 660 A2 | 1/1987 | European Pat. Off. . |
| 0651 429 A1 | 5/1995 | European Pat. Off. . |
| 43 32 657 A1 | 3/1995 | Germany . |
| 5-146984 | 6/1993 | Japan ..................... 414/940 |

Primary Examiner—Christopher P. Ellis
Assistant Examiner—Douglas Hess
Attorney, Agent, or Firm—Evenson, McKeown, Edwards & Lenahan, P.L.L.C.

[57] ABSTRACT

A transfer device for wafers stacked in magazines has a vertically displaceable frame of a platform, with which the cover of the box surrounding the magazine in the closed condition. The magazine remains in the original position on the base of the box and is then supplied by a gripping device from this position to a processing system in which the wafers are removed from the magazine and are processed. A gripping device preferably has two extension arms arranged on both sides of the magazine as well as one stop element which can be caused to impact on the wafer edges. The stop element preferably has two lips consisting of an elastic material which lips can be caused to impact on the wafer edges. The device permits a very fast loading and unloading into or out of the processing system.

14 Claims, 6 Drawing Sheets

TRANSFER APPARATUS FOR WAFERS

The present invention relates to a transfer device for wafers according to the preamble of claim 1 as well as to a process for operating such a transfer device.

The charging of wafers into wafer processing systems conventionally takes place by using containers in the form of standardized boxes. Among experts, such boxes are called SMIFs (Standard Mechanical Interfaces). As a rule, a plurality of wafers, that is, round semiconductor plates, are stored in these boxes while being stored in a stacked manner in a magazine, the boxes having, for example, a removable cover in the form of a hood. The closed boxes are transported to a transfer device in which they are opened while clean-space conditions are maintained and the wafers are supplied to a processing system. After the processing of the wafers, these are transported back into the holding device of the box and the box is closed. Then the boxes can be conveyed by the transfer device.

Conventionally, the boxes are frequently supplied to and removed from the transfer device in a manual manner; that is, the ergonomy of these transfer devices is very important. In particular, as a rule, the height of the supply or removal plane is predetermined for an operation by persons.

In the case of conventional boxes of this type, where the wafers are horizontally disposed in the magazine and which are closed by a hood-shaped cover which can be removed upwards in the vertical direction, a swivel movement of the wafers must often also take place before the actual processing operation in the processing system, before these wafers can be supplied to the processing system, for example, in the vertical position.

Transfer devices for wafer boxes of this type are known, in the case of which the boxes on the charging plane are placed onto a vertically movable charging platform. Then this charging platform is lifted together with the box and subsequently the closing devices of the cover of the box are released. Then the portion of the charging platform on which the base of the magazine rests is lowered again, in which case the cover remains in the lifted position on the frame of the charging platform. By means of gripping devices, the magazine together with the wafers can now be gripped, swivelled and supplied to the processing system in a vertical direction. Finally, the returning of the processed wafers into the magazine takes place in an inverse manner, which magazine together with the base of the box is then lifted again and moved into the cover. After the locking of the closing devices between the base and the cover, the whole charging platform together with the box is lowered again onto the charging plane and can be removed from the transfer device. As the result of the many movements, these transfer devices, on the one hand, require a considerable amount of time for carrying out the loading and unloading operation and, on the other hand, large masses are moved which causes a high consumption of driving energy and also contributes to slowing down the whole process.

It was an object of the present invention to find a transfer device for wafers which are disposed in such boxes, which transfer device can carry out this process in a fast, simple and reliable manner. Simultaneously, ergonomic aspects must also be taken into account and the required clean-space conditions must be maintained.

This object is achieved by the device according to the invention having the characterizing features according to claim 1.

By means of the sequence of movements for the opening of the box and the gripping and transporting of the magazine with the wafers which is simplified in comparison to the initially mentioned known transfer device, advantageously a significantly reduced moving time is achieved which leads to shorter processing times of the wafers and therefore to higher processing capacities. Also, this type of a device according to the invention has a higher durability and a lower susceptibility to wear which results in a higher efficiency in comparison to conventional devices.

Further preferred embodiments of the invention are found in the characteristics of the additional claims 2 to 12.

In particular, the combination of the simplified sequence of movements with the preferred embodiment of the gripping devices permits very high loading and unloading speeds of the boxes. Especially the providing of two extension arms of the gripping device causes an additional stability during the gripping and transporting operation which also results in a high precision of the positioning of the magazine.

According to the invention, a process for the loading and unloading of wafers is also suggested.

The embodiment of the present invention will be described in detail in the following by means of drawings.

Figure 1:
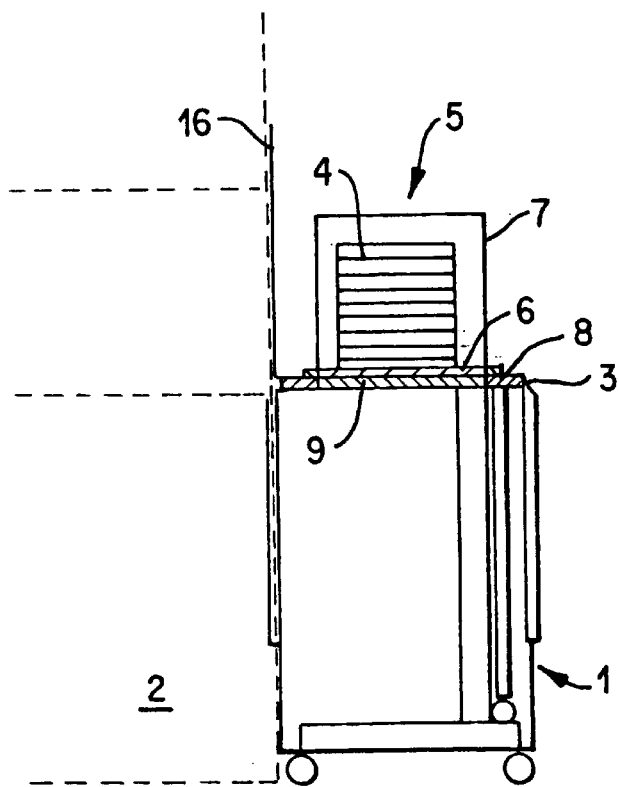
FIG. 1 is a schematic lateral sectional view of a transfer device according to the invention in the charging condition.

FIG. 1 is a lateral sectional view of a transfer device 1 according to the invention which is coupled to a processing system 2 illustrated only schematically by a broken line. The coupling of the transfer device 1 to the processing system takes place by means of conventional fastening devices (not shown), for example, by means of releasable fastening bolts.

Figure 2:
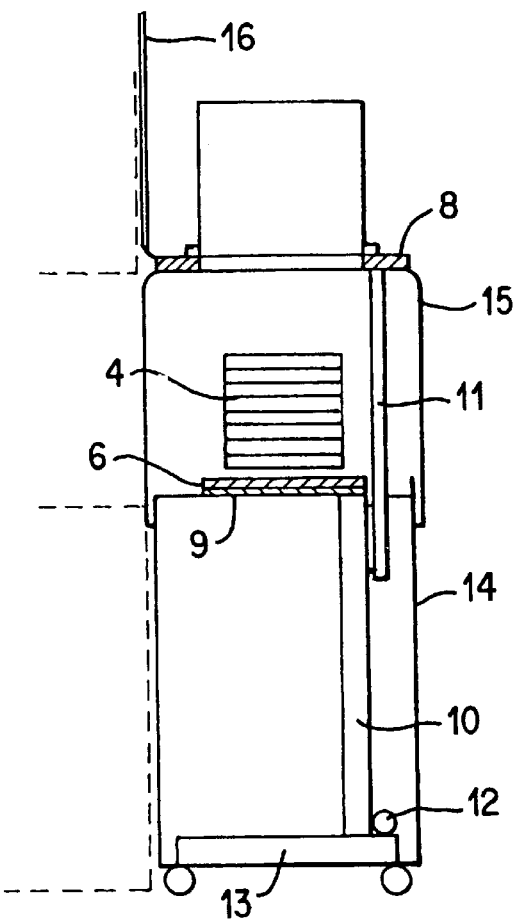
FIG. 2 is a schematic sectional view according to FIG. 1 in the loading and unloading condition.

A box 5 containing a magazine 4 is placed on the charging platform 3 of the transfer device 1. This box 5 is preferably constructed as a standardized SMIF (Standard Mechanical Interface). Such boxes are used for receiving wafers which must be processed and transported until the conclusion of the manufacturing and processing process under clean-space conditions. This box 5 has a base 6 and a hood 7. In the closed condition, the base 6 and the hood 7 are connected with one another by way of a releasable locking mechanism. After the box 5 is placed on the platform 3, the edge of the hood 7 is connected with the frame 8 of the platform 3, and the locking mechanism is released from the base 6 and the hood 7. As a result, according to the invention, the frame 8 together with the hood 7 can now be lifted, in which case the base 6 and thus the magazine 4 situated thereon remain in the present position on the base plate 9 of the platform 3, as illustrated in FIG. 2.

The lifting takes place, for example, by means of a lifting rod 11 which is vertically displaceably disposed in a guide rail 10 and which is connected with the frame 8. The lifting rod 11 is preferably driven by means of a servomotor 12 which is arranged on the housing frame 13 of the transfer device 1.

In the lower area around the housing frame 13, the transfer device 1 has a housing wall 14. A covering 15, which telescopically surrounds the housing wall 14, is also arranged on the movable frame 8 and has a passage opening in the direction of the processing system 2 so that the magazine 4 can be transported from the transfer device 1 to the receiving area of the processing system 2. So that the opening of the receiving area of the processing system 2 is closed toward the outside also in the charging position illustrated in FIG. 1, a cover plate 16 is also arranged on the frame 8 and extends from the platform 3 in the upward direction and in this position covers the mentioned opening of the receiving area.

The advantage of this solution according to the invention is particularly the fact that, in comparison to the initially mentioned known solutions, after the charging of the transfer device 1, only a single lifting operation is required in order to then directly grip the magazine 4 by means of a gripping device and to supply it to the processing system. On the one hand, this results in a shorter transfer time which leads to a higher processing rate of the wafers and thus to lower production costs while the capacity is higher. On the other hand, the shorter moving sequences result in less wear and in a lower susceptibility of the transfer device 1 to disturbances. Finally, the requirements with respect to the ergonomy and the clean space are completely met. Likewise, it is advantageous that the magazine 4 with the wafers is virtually not moved during the operation which almost completely prevents miscellaneous damage because of vibrations during the lifting and lowering of the whole box 5.

Figure 3:
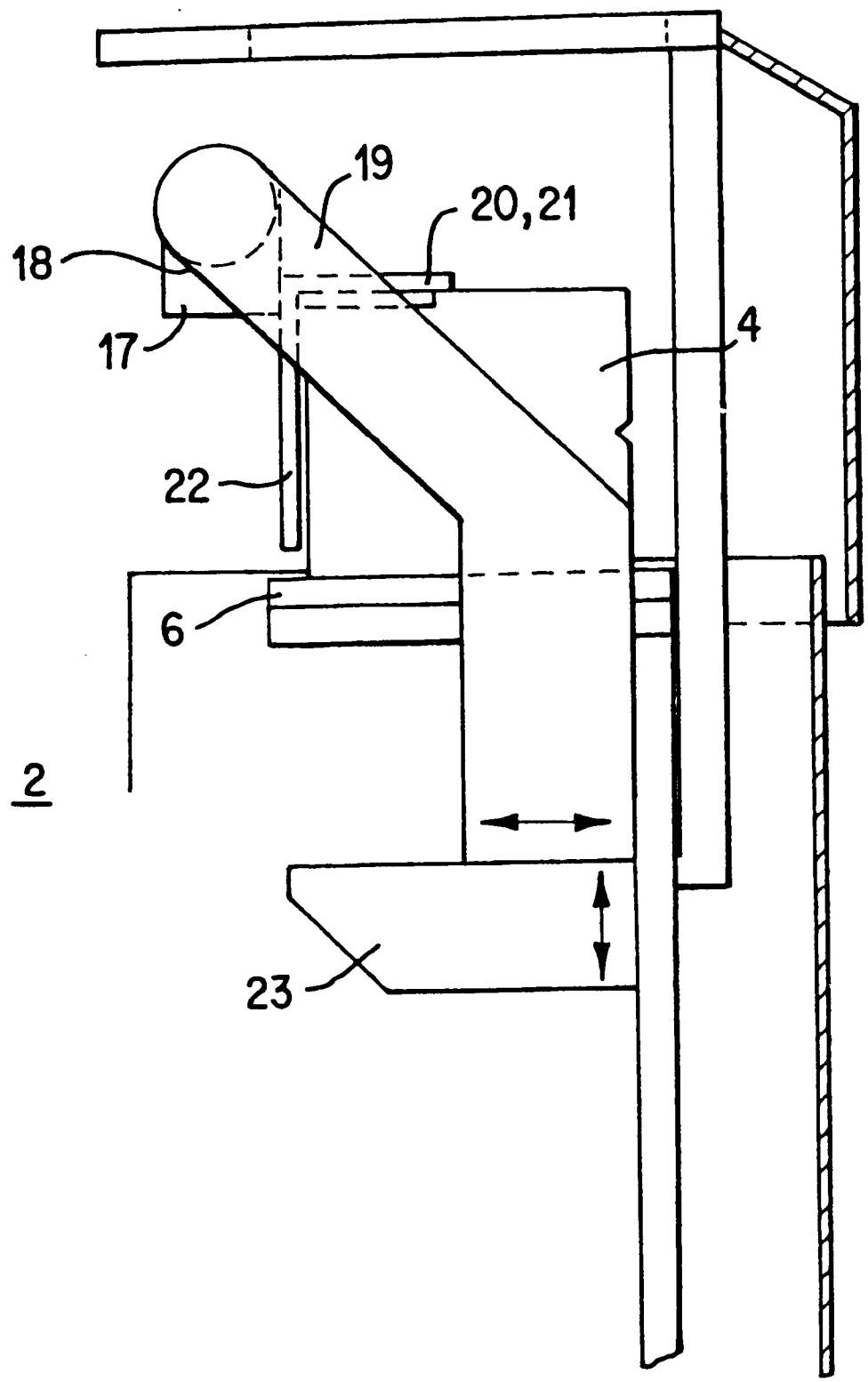
FIG. 3 is a schematic lateral view of the gripping devices according to the invention when gripping the magazine.

Because of the construction of the transfer device 1 according to the invention, a gripping device 17 can be used particularly advantageously which is also designed according to the invention, as illustrated in FIG. 3. For reasons of clarity, the cover 7 of the box 3 is not shown in this figure. According to the invention, the gripping device 17 consists of a basic body 18 which preferably is arranged in a rotatably disposed manner on both sides in an extension arm 19 and of holding fingers 20, 21 which project therefrom and are preferably arranged at a right angle with respect to one another, and of a stop element 22.

Preferably two extension arms 19 are provided which are arranged on both sides of the magazine 4. These extension arms are horizontally displaceably disposed on a console 23 which, in turn, is arranged in a vertically displaceable manner, for example, on the guide rail 10. The directions of the movements are indicated in the figure by arrows on the console 23 or on the extension arm 19.

In the illustrated position, the extension arm 19 or the console 23 were moved or displaced such that the holding fingers 20, 21 laterally engage with the magazine. Simultaneously, the stop element 22 impacts on the forward open side of the magazine 4 with the edges of the wafers stacked therein.

Figure 4:
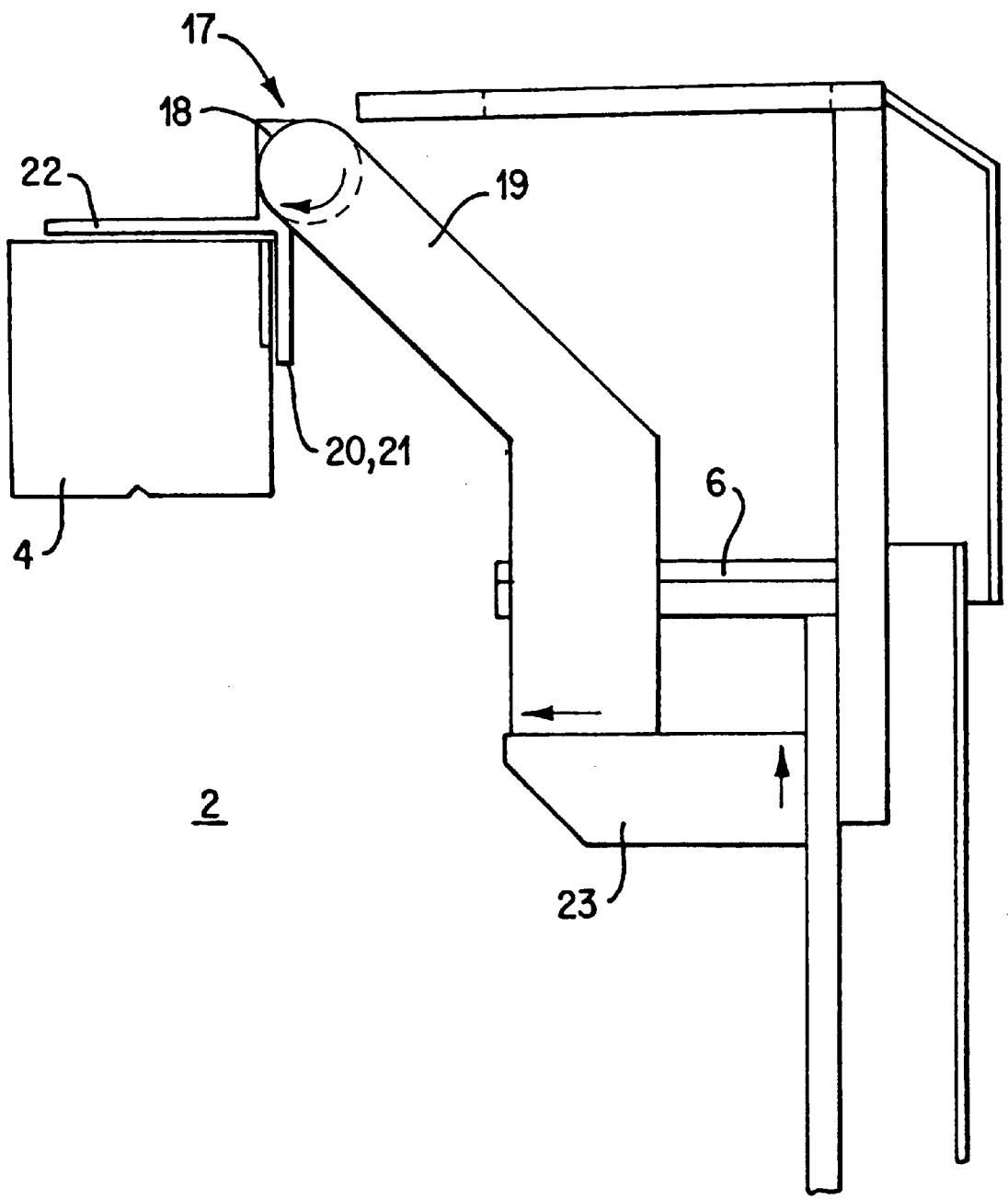
FIG. 4 is the schematic lateral view according to FIG. 3 after the swivelling of the magazine.

By a moving of the console 23 and of the extension arms 19, the magazine 4 can now be lifted off the base 6 and can be guided to the loading space of the processing system (illustrated by the dash-dotted line), as illustrated in FIG. 4 Likewise, the basic body 18 of the gripping device 17 can be swivelled preferably by 90° in order to position the magazine 4 in the required position and alignment. By means of conventional transport devices, such as rolls (not shown) which are arranged in parallel to one another, the wafers can be lifted in this position out of the magazine 4 for a processing inside the processing system 2 and can then be returned to it again. The returning of the magazine 4 to the base 6 finally takes place in the manner which is inverse to the operation described above.

Figure 5:
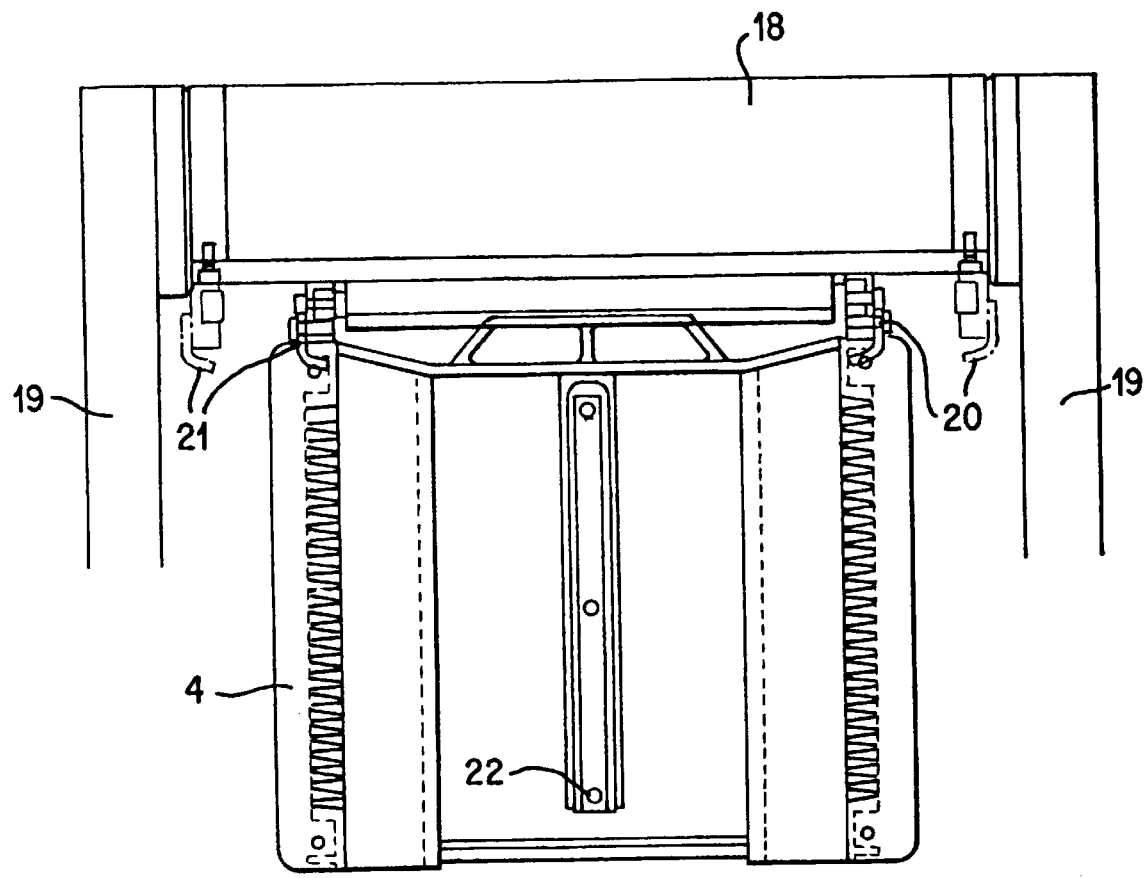
FIG. 5 is the frontal view of a gripping device according to the invention in the area of the magazine.

FIG. 5 is the frontal view of the area of the gripping device 17 of the transfer device 1. The two-sided bearing of the basic body 18 in the two extension arms 19 arranged laterally of the magazine 4 is clearly visible. The two holding fingers 20, 21 are shown by a solid line in the position engaging with the magazine 4. In this position, the magazine 4 can be moved by the extension arms 19 or can be swivelled by rotating the basic body 18. So that the wafers stacked in the magazine 4 cannot fall out or shift, the stop element 22 is provided which is caused to impact toward the open side of the magazine 4 against the edges of the wafers and therefore fixes these wafers in their position. It is also advantageous in this case that the wafers can also not be moved by jolts which may occur as the result of the movement of the extension arms 19 or during the rotating of the basic body 19. Such movements may result in disturbing rattling noises. The gripping device 17 according to the invention is particularly suitable for fast movements which, in addition to the simplified sequence of movements of the platform 3 of the transfer device 1 contributes to a rise of the transfer rate and thus to an increase of the productivity of the device.

Figure 6:
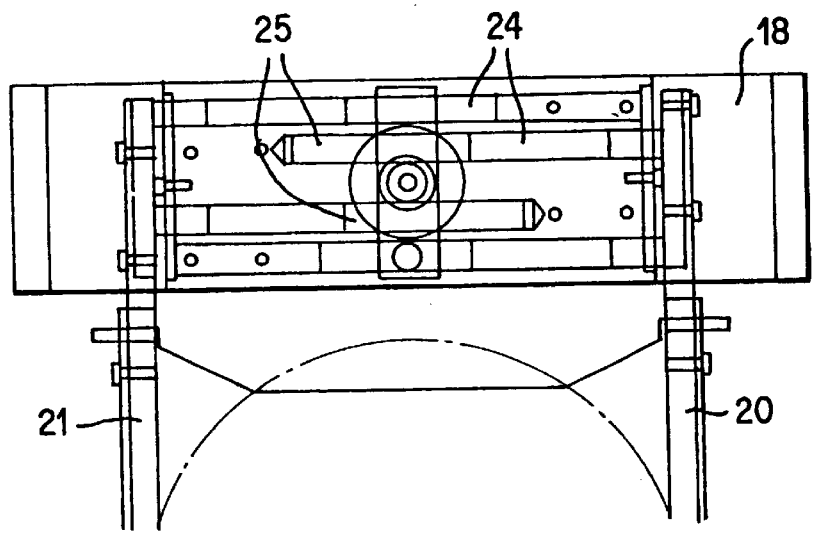
FIG. 6 is a longitudinal sectional view of the basic body of the gripping device according to FIG. 5.

In order to place the gripping device 17 against the magazine 4, the holding fingers 20 and 21 are laterally displaceable, as illustrated particularly clearly in the sectional view of the basic body 18 in FIG. 6, or as illustrated by the position of the holding fingers 20, 21 shown by a broken line in FIG. 5. This displacement is preferably caused by means of pneumatic cylinders 24 which are arranged in the basic body 18. Pistons 25 are arranged in these pneumatic cylinders 24 and are connected with the holding fingers 20 and 21 and transmit the movement to these. The pneumatic control permits very fast movement sequences and strong holding forces for the magazine 4.

Figure 7:
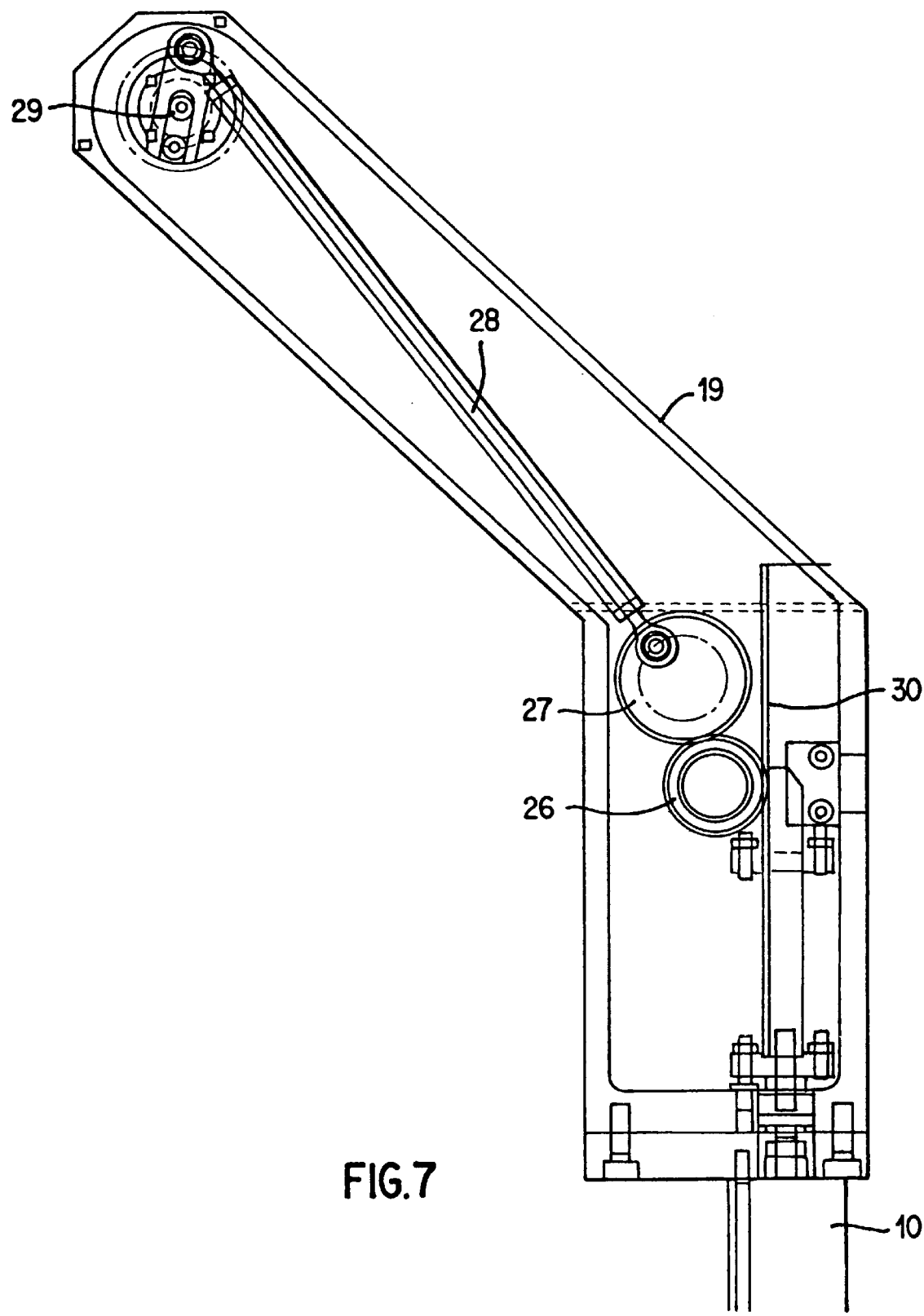
FIG. 7 is a longitudinal sectional view of an extension arm of the gripping device designed according to the invention.

FIG. 7 is a longitudinal sectional view of an extension arm in a preferred embodiment. In this embodiment, the rotating movement of the basic body 18 is not carried out by a separate drive but takes place by way of gear wheels 26, 27 and a rod 28 on the shaft 29 of the basic body 18. In this case, the gear wheel 26 engages in a toothed rack 30 situated on the guide rail 10 and is rotated during a vertical displacement of the extension arm 19 with respect to the guide rail 10. By way of the additional gear wheel 27 and the rod 28, the rotating movement is transmitted to the shaft 29 of the basic body 17 and swivels the latter. Naturally, any other known mechanical transmission of a translational movement into a rotating direction is also suitable for this purpose.

Advantageously, the drive must exist in only one of the two extension arms 18. This development advantageously avoids the providing of an additional driving device, such as an additional driving motor, for the rotating movement of the gripping device 17.

According to the invention, a servomotor is preferably used as a driving device for the lifting movement of the frame 6 or of the console 23. Motors of this type have a behavior which is ideal for this application in that, on the one hand, the movement can be adjusted very precisely and can always be adjusted to the same position and, on the other hand, a slowly rising acceleration and deceleration of the movement can be adjusted. As a result, jerky movements are prevented which may cause a jolting of the wafers in the magazine 4 which is not desirable. Preferably, the vertical movement of the console 23 and of the frame 6 are generated by the same driving motor which is in each case coupled into the transmission line for the corresponding movement.

Figure 8:
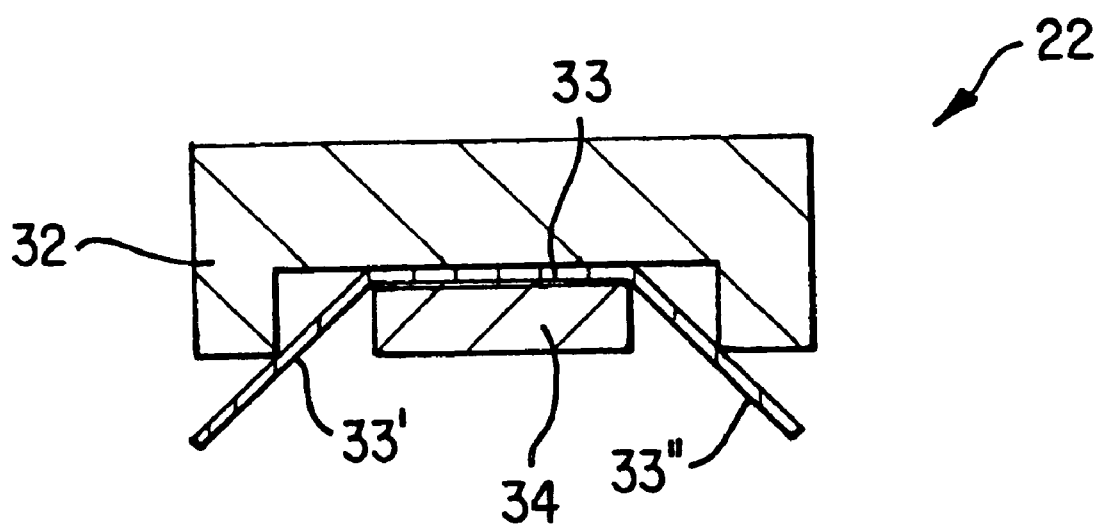
FIG. 8 is a cross-sectional view of the stop element of the gripping device.

Finally, FIG. 8 is a cross-sectional view of the stop element 22, as illustrated in FIG. 5. It is preferably made of a rod 32 having a groove in which a flat strap 33 is fastened which consists of an elastic material. The fastening takes place, for example, by means of a fastening strap 34 which, for example, can be screwed through the strap 33 to the rod 32. As a result of this type fastening, the two lateral edges 33' and 33" of the flat strap 33 are bent to project toward the outside at an angle away from the rod. As a result, the two edges 33' and 33" can advantageously be caused to impact against the edges of the stacked wafers. The stop element 22 is advantageously arranged in the basic body 18 in an independently movable manner.

In the illustrated embodiment, the transfer device 1 is illustrated as a single device for the loading and unloading of a single box 5. The design of the device according to the invention is, however, also preferably suitable for the simultaneous loading and unloading of several boxes 5. For this purpose, the transfer device 1 has a wider construction, and several platforms 6 with several gripping devices 17 are arranged side-by-side in a housing. Advantageously, a single driving motor 12 can then be used for the lifting movements also of several consoles 23 and frames 8 in that the transmission lines are coupled.

We claim:

1. Transfer device for wafers, which are arranged in a stacked manner in a magazine in a box which has a base and a hood-shaped cover, in order to be supplied to a processing system, the transfer device having at least one charging platform for receiving the box and gripping devices; for gripping, swivelling and transporting the magazine, wherein the charging platform has a base plate, on which the base of the box rests, the cover rests on a frame which is vertically movable by a drive, the frame having a downwardly extending covering which comprises the transfer device and which forms a clean space over the area of the base plate in a lifted position of the frame.

2. Transfer device according to claim 1, wherein the drive is a linear motor or a servomotor.

3. Transfer device according to claim 1 or 2, wherein the gripping devices have two holding fingers which can be applied laterally to the magazine and which are laterally displaceably arranged in a rotatably disposed gripping body.

4. Transfer device according to claim 3, wherein, in the gripping body, pneumatically operable pistons are arranged in cylinders which are connected with the holding fingers.

5. Transfer device according to claim 3 or 4, wherein the gripping body is disposed in at least one extension arm arranged laterally of the box, which extension arm is arranged in a horizontally as well as a vertically movable manner in the transfer device.

6. Transfer device according to claim 5, wherein two extension arms are in each case arranged on both sides of the magazine, and the gripping body is arranged to be disposed in said both extension arms.

7. Transfer device according to claim 5 or 6, wherein the gripping body is mechanically coupled with said at least one extension arm in such a manner that, during the vertical movement of the extension arm with respect to the transfer device, the gripping body is swivelled about its bearing shaft.

8. Transfer device according to claim 7, wherein the mechanical coupling is implemented by rods, gear wheels and toothed racks.

9. Transfer device according to any one of claims 1 to 8, wherein a single drive exists for vertical movement of the gripping devices as well as for the lifting and lowering of the frame of the charging platform.

10. Transfer device according to any one of claims 1 to 9, wherein the gripping devices have at least one stop element in the form of a stop rod, which can be caused to impact on the wafer edges of an open side of the magazine.

11. Transfer device according to claim 10, wherein the stop element consists of a dimensionally stable rod which has two lips made of an elastic material which are arranged in parallel to one another and project outwardly.

12. Transfer device according to claim 11, wherein the lips are formed by lateral edges of a flat strap made of an elastic material which is fastened in a groove of the rod by means of a fastening strap.

13. Process for transferring wafers stacked in magazines, by a transfer device into a processing system, the magazines being disposed in a box equipped with a removable hood and being supplied to the transfer device in the horizontal direction, comprising the steps of supplying the box on a loading or unloading plane of the transfer device and placing the box on a platform, releasing or unlocking a cover of the box from a base and then lifting the cover away vertically upwards from a base by a frame, then causing gripping devices of the transfer device to impact with the magazine, with the magazine being lifted away from the base and supplied to the processing system, and, after the processing of the wafers, inversely carrying out the unloading operation.

14. Process according to claim 13, wherein, simultaneously with the lifting-away or returning of the magazine onto the base, a rotating or swivelling movement of the magazine is carried out.

* * * * *